United States Patent
Mochizuki et al.

(10) Patent No.: US 7,750,655 B2
(45) Date of Patent: Jul. 6, 2010

(54) MULTILAYER SUBSTRATE AND PROBE CARD

(75) Inventors: Jun Mochizuki, Nirasaki (JP); Hisatomi Hosaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 294 days.

(21) Appl. No.: 11/597,476

(22) PCT Filed: May 24, 2005

(86) PCT No.: PCT/JP2005/009439

§ 371 (c)(1),
(2), (4) Date: Sep. 11, 2007

(87) PCT Pub. No.: WO2005/114228

PCT Pub. Date: Dec. 1, 2005

(65) Prior Publication Data

US 2008/0191720 A1    Aug. 14, 2008

(30) Foreign Application Priority Data

May 24, 2004    (JP) .............................. 2004-153231

(51) Int. Cl.
*G01R 31/02* (2006.01)
*G01R 31/26* (2006.01)

(52) U.S. Cl. .................... 324/760; 324/754; 324/755; 324/757; 324/765

(58) Field of Classification Search .......... 324/754–765
See application file for complete search history.

(56) References Cited

U.S. PATENT DOCUMENTS

| | | | |
|---|---|---|---|
| 5,521,523 A * | 5/1996 | Kimura et al. ............... | 324/760 |
| 5,576,630 A | 11/1996 | Fujita | |
| 6,191,604 B1 * | 2/2001 | Haseyama et al. .......... | 324/765 |
| 6,433,563 B1 | 8/2002 | Maruyama | |
| 6,563,330 B1 | 5/2003 | Maruyama et al. | |
| 7,002,363 B2 * | 2/2006 | Mathieu ...................... | 324/758 |
| 2002/0053922 A1 | 5/2002 | Iino | |
| 2003/0127246 A1 | 7/2003 | Watanabe et al. | |
| 2003/0160626 A1 | 8/2003 | Maruyama et al. | |
| 2004/0183556 A1 * | 9/2004 | Wada et al. .................. | 324/754 |
| 2007/0178727 A1 * | 8/2007 | Igarashi et al. ................ | 439/91 |

FOREIGN PATENT DOCUMENTS

| | | |
|---|---|---|
| EP | 0 629 867 A1 | 12/1994 |
| EP | 1 045 438 A2 | 10/2000 |

(Continued)

*Primary Examiner*—Ha Tran T Nguyen
*Assistant Examiner*—Emily Y Chan
(74) *Attorney, Agent, or Firm*—Finnegan, Henderson, Farabow, Garrett & Dunner, L.L.P.

(57) ABSTRACT

It is an object of the present invention to dramatically reduce thermal deformation without using any special material in a multilayer substrate and a probe card.

According to the present invention, in a probe card including at least one circuit board connected in an electrically conductive manner to a probe brought into electrical contact with an inspection object, the circuit board includes a base layer and a surface layer stacked on at least an inspection object side surface of the base layer. The surface layer has a higher coefficient of thermal expansion than that of the base layer, and grooves dividing the surface layer into a plurality of areas are provided in the surface layer.

15 Claims, 5 Drawing Sheets

FOREIGN PATENT DOCUMENTS

| | | |
|---|---|---|
| EP | 1 077 381 A2 | 2/2001 |
| JP | 405218149 * | 8/1993 |
| JP | 07-63786 | 3/1995 |
| JP | 07-063787 | 3/1995 |
| JP | 2000-306961 | 11/2000 |
| JP | 2001-056346 | 2/2001 |
| JP | 2002-141379 | 5/2002 |
| JP | 2003-501819 | 1/2003 |
| JP | 2003-506686 | 2/2003 |
| JP | 2003-207523 | 7/2003 |
| JP | 2003-279594 | 10/2003 |
| JP | 2004-501517 | 1/2004 |
| WO | WO 00/73905 A2 | 12/2000 |
| WO | WO 01/09623 A1 | 2/2001 |
| WO | WO 01/98793 A2 | 12/2001 |

* cited by examiner

MULTILAYER SUBSTRATE AND PROBE CARD

TECHNICAL FIELD

The present invention relates to a multilayer substrate and a probe card, more particularly, to a multilayer substrate and a probe card whose thermal deformation can be reduced.

BACKGROUND ART

Multilayer substrates have conventionally been indispensable components as substrates to mount thereon electronic components used in electronic devices and in precision instruments such as measuring devices. Since these electronic devices and precision instruments are used under various environments from a low-temperature environment to a high-temperature environment, the multilayer substrates need to have weather resistance according to the various environments. For example, as shown in FIG. 8, a multilayer substrate 1 has a base layer 2, a surface layer 3, and a plurality of electrodes 4. When the multilayer substrate 2 is exposed to a high-temperature environment in a case where the surface layer 3 has a larger coefficient of thermal expansion than that of the base layer 2, the surface layer 3 expands to a larger extent than the base layer 2, so that the multilayer substrate 1 bends as shown by the arrow in the drawing. Though FIG. 8 shows both the base layer 2 and the surface layer 3 as a single layer, the base layer 2 of the multilayer substrate 1 is generally structured as a multilayer substrate composed of a plurality of layers.

In a case of a probe device which inspects electrical characteristics of devices in a semiconductor manufacturing field, since the probe device conducts low-temperature tests and high-temperature tests according to the environments where the devices are used, a circuit board used for the probe device is liable to be thermally deformed due to the influence of temperature. In particular, a multilayer substrate used for the probe card is directly exposed to a low-temperature environment or a high-temperature environment and thus is especially greatly influenced by temperature.

A probe device includes, for example, as shown in FIG. 9(a), a loader chamber 1 for transferring a wafer W and a prober chamber 2 in which electrical characteristics of the wafer W delivered from the loader chamber 1 are inspected. As shown in FIG. 9(a), the prober chamber 2 includes: a mounting table (main chuck) 3 on which the wafer W carried from the loader chamber 1 is placed and which is provided with a built-in lifting mechanism; an XY table 4 for moving the main chuck 3 in an X direction and a Y direction; a probe card 5 disposed above the main chuck 3 moved by the XY table; a card holding mechanism (hereinafter, referred to as a "clamp mechanism", not shown) holding the probe card 5 in an attachable/detachable manner; and an alignment mechanism 6 accurately aligning a plurality of probes 5A of the probe card 5 with a plurality of electrode pads of the wafer W on the main chuck 3. The alignment mechanism 6 includes an upper camera 6A capturing an image of the wafer W and a lower camera 6B capturing images of the probes 5A.

Further, as shown in FIG. 9(a), a head plate 7 is disposed on an upper surface of the prober chamber 2, and the clamp mechanism holding the probe card 5 in the attachable/detachable manner is fitted in an opening portion of the head plate 7. A test head T of a tester (not shown) is rotatably disposed on the head plate 7, and the test head T and the probe card S are electrically connected to each other via a connection ring (pogo ring) 8. The tester transmits inspection signals to the probes 5A via the test head T, a performance board, and the pogo ring 8, and the probes 5A apply the inspection signals to the electrode pads of the wafer W, thereby inspecting the electrical characteristics of a plurality of semiconductor elements (devices) formed on the wafer W.

In a case where a circuit board 5B included in the probe card S includes, for example, as shown in FIG. 9(b): a base layer 5C made of an inorganic insulating material such as glass fiber; surface layers 5D stacked on both surfaces of the base layer 5C and made of an organic insulating material such as resin; and electrodes 5E, the surface layer 5D on a main chuck 3 side (lower side in the drawing) becomes higher in temperature than the surface layer 5D on a pogo ring 8 side (upper side in the drawing) to greatly expand at the time of high-temperature inspection, and consequently, the circuit board 5B bends in the arrow direction to cause misalignment of the electrodes 5E with pogo pins of the pogo ring 8, which may possibly deteriorate reliability of the inspection.

In view of the above, Patent document 1 proposes a jig for semiconductor device inspection (pin probe-type jig small in thermal deformation). The jig for semiconductor device inspection described in Patent document 1 is composed of a probe and a multilayer printed wiring board, and the multilayer printed wiring board includes a conductor circuit 1 having a terminal connected to at least the probe, a conductor circuit 2 having a terminal connected to an inspection device, two or more layers of electric insulating layers supporting these circuit conductor layers, and a through hole electrically connecting these circuit conductor layers, and a coefficient of thermal expansion in a planar direction of the electric insulating layer supporting the conductor circuit 1 is smaller than a coefficient of thermal expansion in the planar direction of the electric insulating layer supporting the conductor circuit 2.

[Patent document 1] Japanese Patent Application Laid-open No. Hei 9-133710

DISCLOSURE OF THE INVENTION

Problems to be Solved by the Invention

However, the multilayer printed wiring board used in the jig for semiconductor device inspection described in Patent document 1, though can be small in thermal deformation, had a problem of increasing manufacturing cost since a material (inorganic insulating material such as glass fiber cloth) forming the electric insulating layers has to be selected from a large number of materials so that the coefficient of thermal expansion in the planar direction of the electric insulating layer supporting the conductor circuit 1 becomes smaller than the coefficient of thermal expansion in the planar direction of the electric insulating layer supporting the conductor circuit 2 and thus the layer structure of the electric insulating layers needs special specifications.

The present invention was made to solve the above problems and an object thereof is to provide a multilayer substrate and a probe card whose thermal deformation can be dramatically reduced and which can be manufactured at low cost without using any special material.

Means for Solving the Problems

A multilayer substrate of the present invention is a multilayer substrate including: a base layer; and a surface layer stacked on at least one surface of the base layer, the surface layer having a higher coefficient of thermal expansion than a coefficient of thermal expansion of the base layer, wherein grooves dividing the surface layer into a plurality of areas are provided in the surface layer.

The base layer may be exposed from the grooves dividing the surface layer. Further, a second surface layer may be provided on the other surface of the base layer. Further, the surface layer may be made of an organic insulating material, and the base layer may be made of an inorganic insulating material.

A probe card of the present invention is a probe card including at least one circuit board connected in an electrically conductive manner to a probe brought into electrical contact with an inspection object, wherein the circuit board includes: a base layer; and a surface layer stacked on at least a surface on the inspection object side of the base layer, the surface layer has a higher coefficient of thermal expansion than a coefficient of thermal expansion of the base layer, and grooves dividing the surface layer into a plurality of areas are provided in the surface layer.

According to another aspect of the present invention, the present invention is a probe card including a contactor brought into electrical contact with an inspection object, the contactor including a plurality of probes and a circuit board to which the probes are attached, wherein the circuit board includes: a base layer; and a surface layer stacked on at least a surface on the inspection object side of the base layer, the surface layer has a higher coefficient of thermal expansion than a coefficient of thermal expansion of the base layer, and grooves dividing the surface layer into a plurality of areas are provided in the surface layer.

Further, in the probe card of the present invention, the base layer may be exposed from the grooves dividing the surface layer. Further, a second surface layer may be provided on the other surface of the base layer. Further, the surface layer may be made of an organic insulating material and the base layer may be made of an inorganic insulating material.

EFFECT OF THE INVENTION

According to the present invention, it is possible to dramatically reduce thermal deformation and to manufacture a multilayer substrate and a probe card at low cost without using any special material.

EXPLANATION OF CODES

Figure 1:
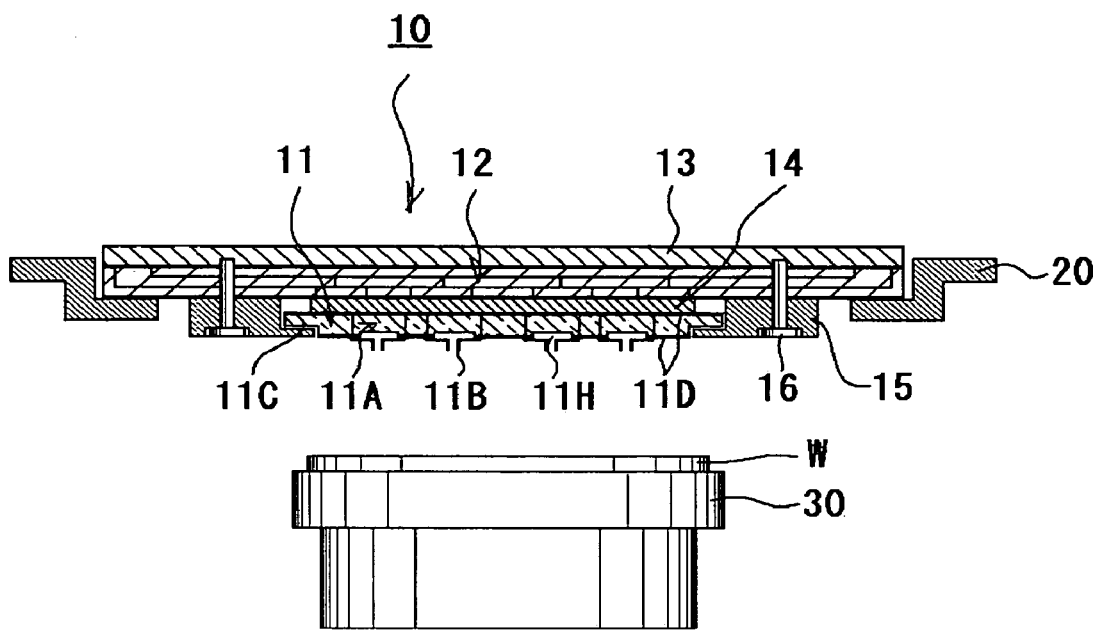
[FIG. 1] A cross-sectional view showing a usage state of one embodiment of a probe card of the present invention.

10 probe card
11 contactor
11A second circuit board
11C base layer
11D, 11E surface layer
11I groove
12 circuit board
12A base layer
12B, 12C surface layer
12F groove
50 multilayer substrate
51 base layer
52 surface layer
54 groove

BEST MODE FOR CARRYING OUT THE INVENTION

Figure 3:
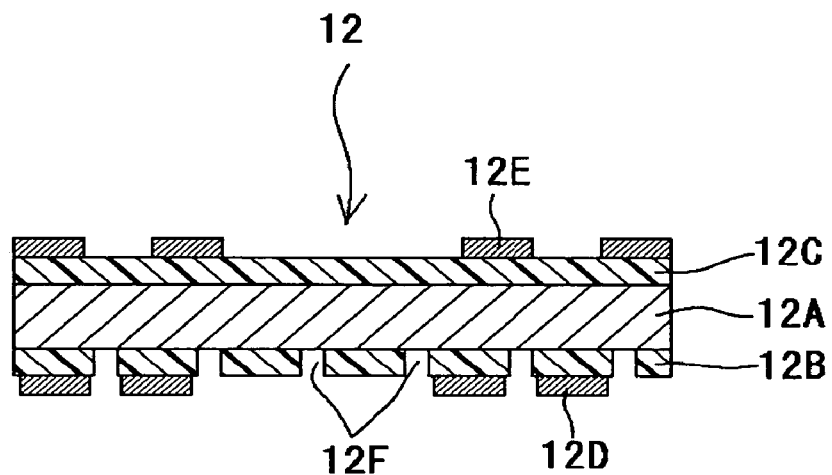
[FIG. 3] A cross-sectional view showing part of a circuit board of the probe card in FIG. 1.
Figure 4:
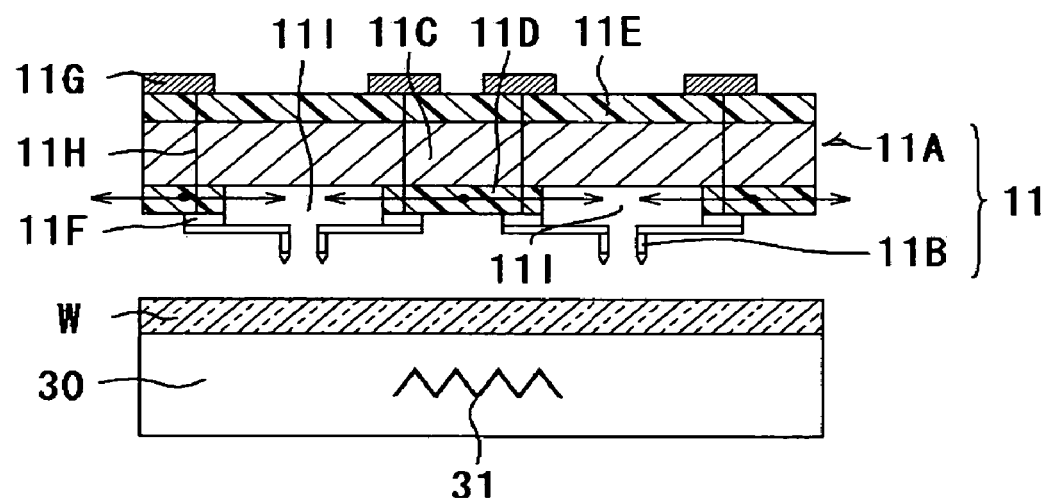
[FIG. 4] A cross-sectional view schematically showing the relation of the contactor in FIG. 2 and a main chuck.
Figure 5A:
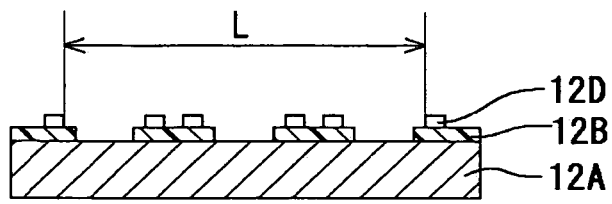
[FIG. 5](a) to (c) are cross-sectional views to illustrate portions where a coefficient of thermal expansion of the circuit board is measured.
Figure 5B:
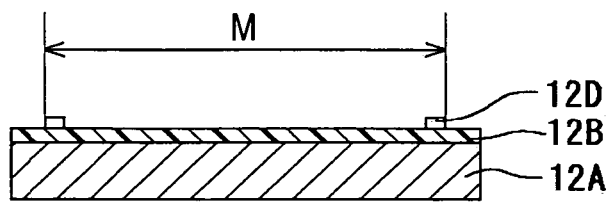
Figure 5C:
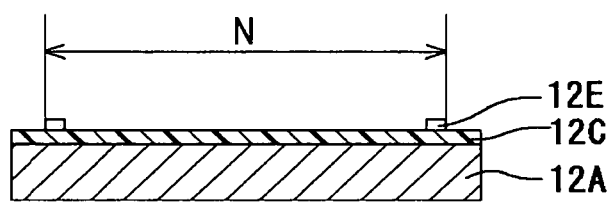
Figure 6:
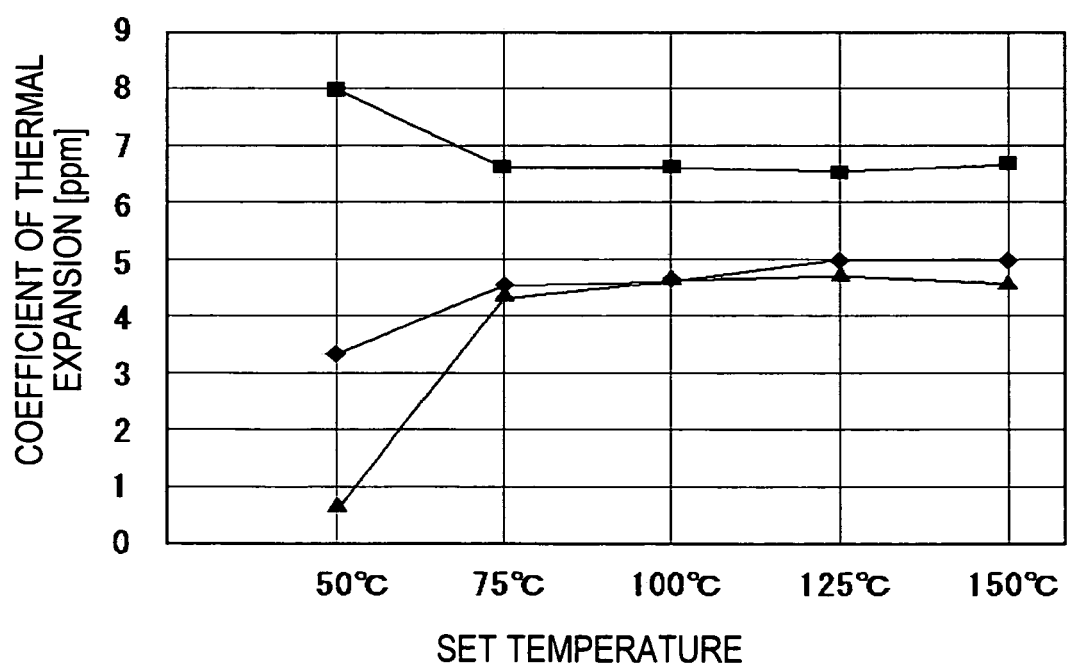
[FIG. 6] A graph showing the correlation between temperature and the coefficient of thermal expansion of the circuit board shown in FIG. 3.
Figure 7:
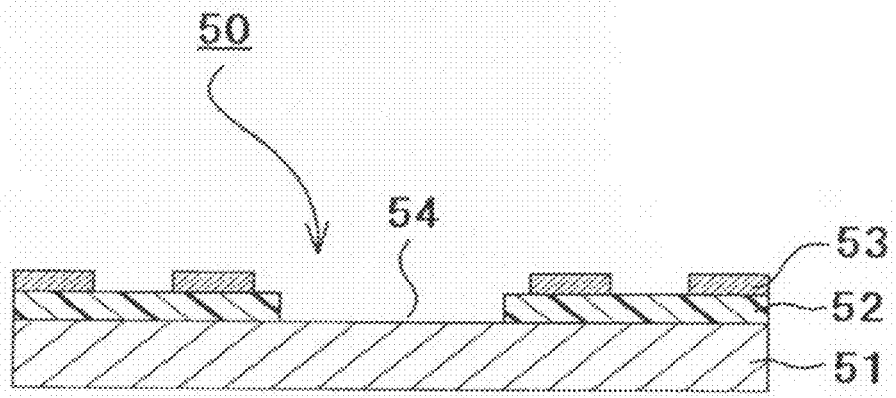
[FIG. 7] A cross-sectional view showing an essential part of another embodiment of a multilayer substrate of the present invention.
Figure 8:
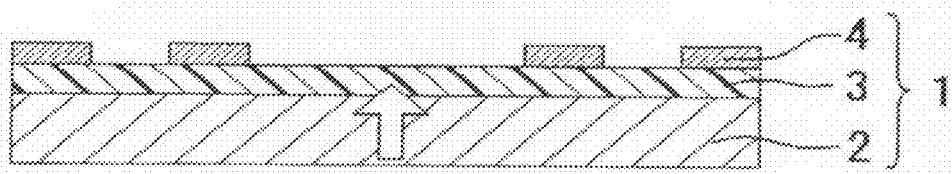
[FIG. 8] A cross-sectional view to illustrate thermal deformation of a conventional multilayer substrate.
Figure 9A:
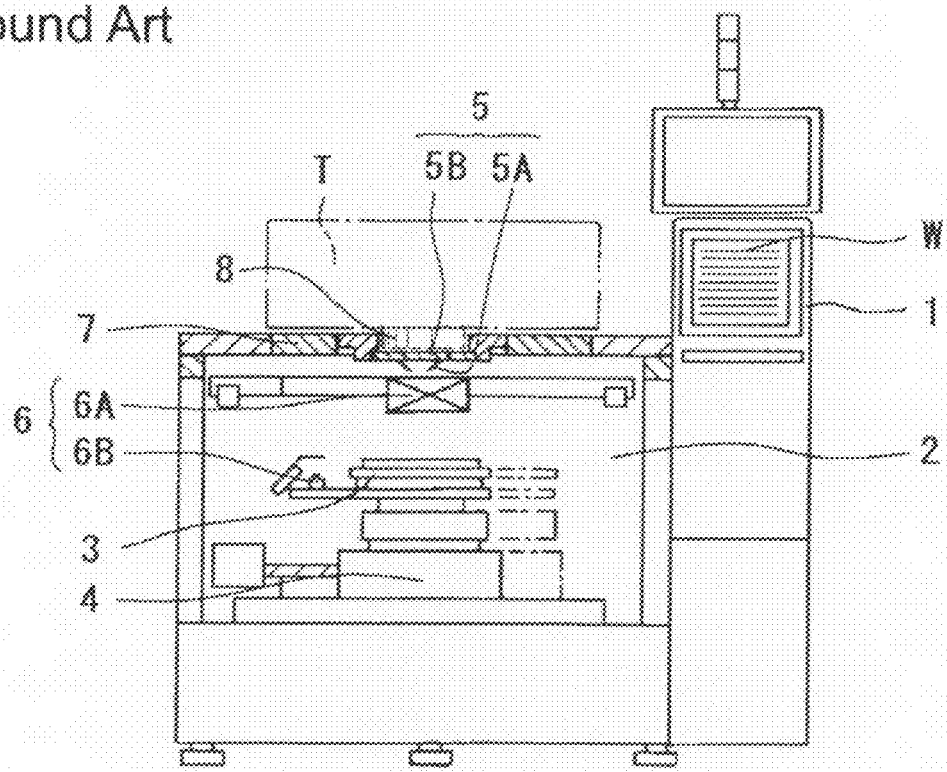
[FIG. 9](a) is a cross-sectional view, partly in cutaway, of a tester to which a conventional probe card is applied, and (b) is a cross-sectional view to illustrate thermal deformation of a circuit board applied to the probe card shown in (a).
Figure 9B:
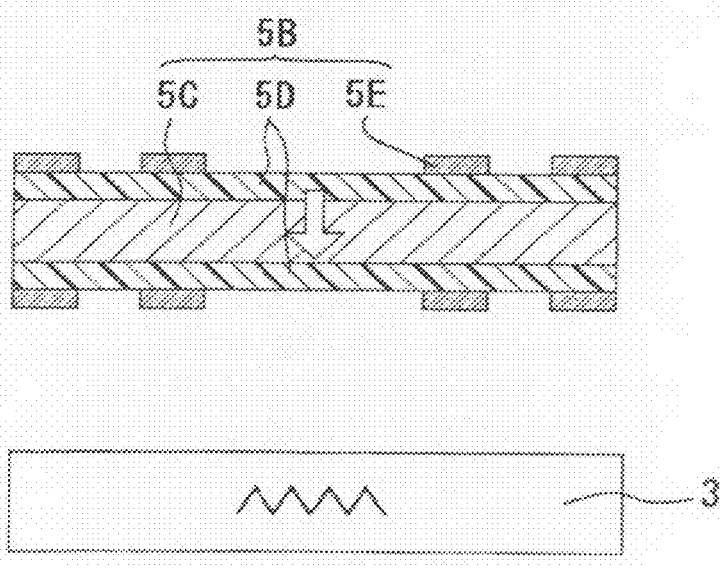

Hereinafter, the present invention will be described based on embodiments shown in FIG. 1 to FIG. 7. FIG. 1 is a cross-sectional view showing a usage state of one embodiment of a probe card of the present invention, FIG. 2 is a cross-sectional view showing an essential part of a contactor shown in FIG. 1, FIG. 3 is cross-sectional view showing part of a circuit board shown in FIG. 1, FIG. 4 is a cross-sectional view schematically showing the relation of the contactor in FIG. 2 and a main chuck, FIGS. 5(a) to (c) are cross-sectional views to illustrate portions where a coefficient of thermal expansion of the circuit board is measured, FIG. 6 is a graph showing the correlation between temperature and the coefficient of thermal expansion of the circuit board shown in FIG. 3, and FIG. 7 is a cross-sectional view showing an essential part of another embodiment of a multilayer substrate of the present invention.

As shown in, for example, FIG. 1, a probe card 10 of this embodiment includes: a contactor 11 brought into electrical contact with an inspection object, for example, a wafer W; a circuit board 12 connected in an electrically conductive manner to the contactor 11; and a reinforcing member 13 reinforcing the circuit board 12, and the probe card 10 is mounted in a probe chamber (not shown) of a prober via a card holder 20, and is disposed to face the wafer W on a main chuck 30. An interposer (connecting/mediating medium) 14 is interposed between the contactor 11 and the circuit board 12, so that the contactor 11 and the circuit board 12 are electrically connected to each other via the interposer 14. The contactor 11 is fixed to the circuit board 12 by a fixture 15 and fastening members 16 with the interposer 14 interposed therebetween.

Figure 2:
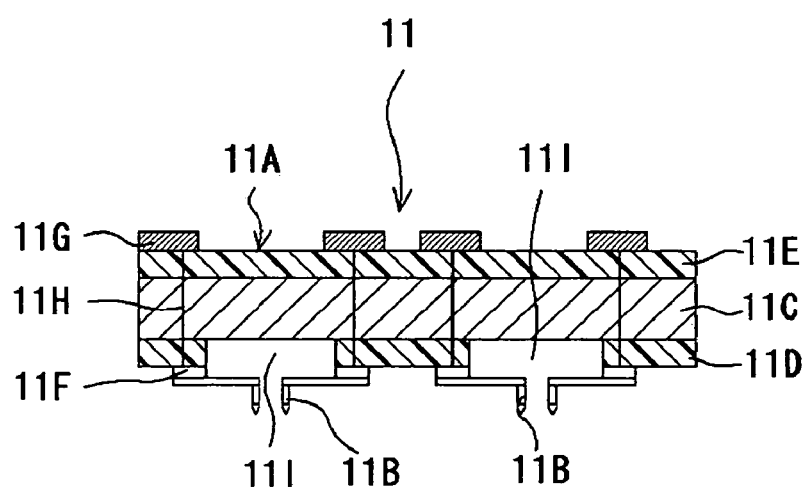
[FIG. 2] A cross-sectional view showing an essential part of a contactor of the probe card in FIG. 1.

As shown by a partial enlarged view in FIG. 2, the contactor 11 includes, for example: a second circuit board 11A; and a plurality of probes 11B disposed on a lower surface of the second circuit board 11A in correspondence to a plurality of electrode pads (not shown) of the wafer W. The second circuit board 11A has: a base layer 11C made of, for example, an inorganic insulating material such as ceramic; surface layers 11D, 11E stacked on a lower surface and an upper surface of the base layer 11C respectively and made of an organic insulating material such as polyimide resin; terminal electrodes 11F, 11G formed on the upper and lower surface layers 11D, 11E respectively in correspondence to the probes 11B; and wirings 11H connecting the upper and lower terminal electrodes 11F, 11G, and a plurality of chips can be inspected simultaneously.

In a case where the base layer 11C of the contactor 11 is made of, for example, ceramic, the contactor can be formed by using microfabrication technology such as, for example, michromachining technology. Further, each of the base layer 11C and the surface layers 11D, 11E may be formed of a single layer or may be formed of a plurality of layers. The wirings 11H are made of via-hole conductors or conductor patterns formed in the base layer 11C and the surface layers 11D, 11E.

Since a coefficient of thermal expansion of the surface layers 11D, 11E which are made of an organic insulating material is higher than that of the base layer 11C which is made of an inorganic insulating material, the surface layers 11D, 11E expand to a greater extent than the base layer 11C, and the lower surface layer 11D expands to a greater extent than the upper surface layer 11E, and therefore, unless some measure is taken, the second circuit board 11A would bulge downward and bend downward to deform.

Therefore, in this embodiment, a plurality of grooves 11I are provided in the lower surface layer 11D and these grooves 11I divide the surface layer 11D into a plurality of areas. It is possible to form these grooves 11I simultaneously with the formation of the surface layer 11D by, for example, screen-printing the surface layer 11D. By thus providing the plural grooves 11I in the lower surface layer 11D, the surface layer 11D is divided into the plural areas to be turned into a plurality of small independent thermal expansion areas which are dispersedly provided, whereby thermal expansion of the lower surface layer 11D is made smaller than thermal expansion of the upper surface layer 11E, which makes it possible to reduce thermal deformation of the circuit board 11A, and as a result, thermal deformation of the contactor 11. Therefore, it is possible to surely bring the probes 11B into contact with the electrode pads of the wafer W and surely bring the terminal electrodes 11G into contact with the interposer 14, which can enhance reliability of the inspection. These grooves 11I may be provided in plurality in one direction out of a longitudinal direction and a lateral direction in the lower surface layer 11D or may be provided in plurality in the two longitudinal and lateral directions, within a range not impairing a circuit pattern. In this embodiment, the grooves 11I are provided only in the one direction.

Further, as for the circuit board 12 in contact with the pogo ring, the same measure against heat as that for the second circuit board 11A is taken. Specifically, for example, as shown in FIG. 3, the circuit board 12 includes: a base layer 12A made of an inorganic insulating material such as ceramic or glass fiber; surface layers 12B, 12C stacked on upper and lower surfaces of the base layer 12A and made of an organic insulating material such as polyimide resin; and terminal electrodes 12D, 12E formed on the upper and lower surface layers 12B, 12C respectively, and a plurality of grooves 12F are formed in the lower surface layer 12B by a screen printing method or the like, similarly to the case of the second circuit board 11A.

The plural terminal electrodes 12D on the lower side of the circuit board 12 are in electrical contact with contact terminals (not shown) of the interposer 14, and the plural upper terminal electrodes 12E are in electrical contact with pogo pins included in the pogo ring, so that the circuit board 12 has a function of electrically connecting the contactor 11 and the pogo ring (not shown) to each other. Facing the probe chamber side, the lower surface layer 12B becomes higher in temperature than the upper surface layer 12C at the time of the inspection, but since the plural grooves 12F are provided in the lower surface layer 12B, these grooves 12F prevent the circuit board 12 from bending due to thermal deformation. Therefore, it is possible to surely bring the upper and lower terminal electrodes 12D, 12E of the circuit board 12 into contact with the interposer 14 and the pogo pins respectively, which as a result can enhance reliability of the inspection.

Next, the operation of the probe card 10 will be described. As shown in FIG. 4, the wafer W is placed on the main chuck 30, and high-temperature inspection of the wafer W is conducted by heating the wafer W up to, for example, about 150° C. by a heating source 31 of the main chuck 30. At the time of the inspection, the main chuck 30 is moved in the X and Y directions to index the wafer W, and repeatedly ascends and descends in a Z direction to repeatedly cause the contact and separation of the contactor 11 and the wafer W. Therefore, the temperature of the probe card 10 also rises up to a temperature close to 150° C. similarly to the temperature of the wafer W.

At this time, the lower surface of the second circuit board 11A becomes higher in temperature than the upper surface thereof, so that a great temperature difference occurs between the lower surface layer 11D and the upper surface layer 11E. Moreover, since the base layer 11C is made of ceramic and the surface layer 11D is made of polyimide resin, the surface layers 11D, 11E expand to a greater extent than the base layer 11C, and the lower surface layer 11D expands to a greater extent than the upper surface layer 11E, so that the second circuit board 11A tries to bulge downward to bend downward. However, since the lower surface layer 11D is divided into the plural areas by the grooves 11I as previously described, each of the division areas of the surface layer 11D independently makes thermal deformation, so that thermal expansions of adjacent areas act as forces to cancel each other's deformation caused by expansion as shown by the arrow in FIG. 4, which can prevent the thermal expansion of the whole surface layer 11D, and as a result, the thermal expansion of the lower surface layer 11D becomes closer to the thermal expansion of the upper surface layer 11E and consequently, the thermal deformation of the second circuit board 11A can be greatly reduced. As a result, the probes 11B of the contactor 11 surely come into contact with the wafer W on the main chuck 30 and the terminal electrodes 11G surely come into contact with the interposer 14, which can enhance reliability of the inspection.

Further, since the circuit board 12 in electrical contact with the pogo ring also has grooves 12F in the lower surface layer 12B facing the inside of the probe device, similarly to the second circuit board 11A of the contactor 11, even if the lower surface layer 12B becomes higher in temperature than the upper surface layer 12C, the areas made by the division by the grooves 12F independently expand and the thermal expansions of the adjacent areas are cancelled by each other, so that thermal expansion of the lower surface layer 12B is greatly reduced, which as a result can prevent the circuit board 12 from bending due to thermal deformation. Therefore, the upper and lower terminal electrodes 12D, 12E are kept in an initial contact state with the interposer 14 and the pogo ring respectively without any displacement, which can enhance reliability of the inspection.

In order to observe the deformation of the circuit board 12 due to the thermal expansion, a circuit board having the same structure as that of the circuit board 12 was fabricated in a rectangular shape and was prepared as a measurement substrate. This measurement substrate was heated from room temperature to 150° C., expansion amounts of the measurement substrate at 50° C., 75° C., 100° C., 125° C., and 150° C. were measured at a plurality of places, and coefficients of thermal expansion at the respective measured places were calculated based on these measurement results. In the measurement substrate used here, the grooves 12F with 3 mm width were provided in the lower surface layer 12B to be arranged in one direction and in parallel to each other and no groove was provided in the upper surface layer 12C.

In the surface layer 12B having the grooves 12F, five places within a range (L) of 35.103 to 35.118 mm crossing three of the grooves 12F as shown in FIG. 5(a) were sampled, coefficients of thermal expansion at each of the set temperatures were calculated based on amounts of expansion at the respective places, and average values of the coefficients of thermal expansion of the five places at the respective set temperatures are shown by the marks ♦ in the graph in FIG. 6. Further, ten places within a range (M) from 96.925 to 98.411 mm along a direction orthogonal to the direction in FIG. 5(a), that is, along the grooves 12F as shown in FIG. 5(b) were sampled, coefficients of thermal expansion at each of the set temperatures were calculated based on amounts of expansion at the respective places, and average values of the coefficients of thermal expansions of the ten places at the respective set temperatures are shown by the marks ▲ in the graph in FIG. 6. Further, as for the surface layer 12C without any groove, ten places within a range (N) from 96.003 to 98.021 mm as shown in FIG. 5(c) were sampled, coefficients of thermal expansion at each of the set temperatures were calculated based on amounts of expansion of the respective places, and average values of the coefficients of thermal expansion of the ten places at the respective set temperatures are shown by the marks ■ in the graph in FIG. 6. Each of FIGS. 5(a) to (c) show the circuit board in which the surface layer 12B or the surface layer 12C is provided only on one surface, but actually, a circuit board in which the surface layers 12B, 12C were provided on both surfaces of the base layer 12A respectively was used.

According to the results shown in FIG. 6, the surface layer 12B in which the grooves 12F were provided exhibited a coefficient of thermal expansion of 4.4 to 5.0 ppm under high temperature of 75 to 150° C. both in the direction crossing the grooves 12F and in the direction orthogonal thereto. On the other hand, the surface layer 12C without any groove exhibited a coefficient of thermal expansion of 6.6 to 6.7 ppm under high temperature of 75 to 150° C., and thus it has been found that the coefficient of thermal expansion of the surface layer 12C without any groove is higher than the coefficient of thermal expansion of the surface layer 12B in which the grooves 12F are provided. Therefore, it has been confirmed that providing the grooves 12F in the surface layer 12B can reduce thermal expansion of the surface layer 12B, and as a result can reduce thermal deformation of the measurement substrate, and therefore, the grooves 12F are effective to reduce thermal deformation of the substrate.

As has been described, according to this embodiment, in the probe card including the circuit board 12 connected in an electrically conductive manner to the probes 11B brought into electrical contact with the wafer W, the circuit board 12 includes the base layer 12A and the surface layers 12B, 12C stacked on the upper and lower surfaces of the base layer 12A respectively, and since the surface layers 12B, 12C have a higher coefficient of thermal expansion than that of the base layer 12A and the grooves 12F dividing the surface layer 12B on the wafer W side into the plural areas are provided in the surface layer 12B, it is possible to make an amount of thermal expansion of the surface layer 12B on the wafer W side smaller than an amount of thermal expansion of the surface layer 12C on the pogo ring side. Therefore, it is possible to reduce thermal deformation of the circuit board 12 to surely prevent misalignment of the circuit board 12 with the interposer 14 and the pogo ring, which as a result can improve reliability of the inspection of the wafer W. Moreover, since it is only necessary to provide the plural grooves 12F in the lower surface layer 12B, it is possible to manufacture the circuit board 12 at low cost without using any special material for the base layer 12A and the surface layer 12B.

Further, according to this embodiment, since the second circuit board 11A included in the contactor 11 also has the plural grooves 11I in the surface layer 11D on the wafer W side, similarly to the circuit board 12, it is possible to make an amount of thermal expansion of the surface layer 11D on the wafer W side smaller than an amount of thermal expansion of the surface layer 11E on the interposer 14 side, and as a result, it is possible to reduce thermal deformation of the second circuit board 11A, whereby the misalignment of the contactor 11 with the wafer W and the interposer 14 can be surely prevented, which can improve reliability of the inspection of the wafer W.

Further, according to this embodiment, since the base layer 12A of the circuit board 12 is made of the inorganic insulating material such as glass fiber and the surface layers 12B, 12C are made of the organic insulating material such as polyimide resin, it is possible to form internal wirings and the electrodes 12D, 12E by a buildup method or the like with high accuracy. Moreover, the base layer 12A, if made of ceramic, can have heat resistance and the like. Further, as for the second circuit board 11A included in the contactor 11, the same operation and effects as those of the circuit board 12 can be expected. Moreover, by making the second circuit board 11A of ceramic, it is possible to cope with the miniaturization of the probes 11B.

FIG. 7 shows a multilayer substrate having a surface layer only on one surface. Specifically, a multilayer substrate 50 has: a base layer 51; a surface layer 52 stacked on an upper surface of the base layer 51; and electrodes 53 formed on the surface layer 52, and the surface layer 52 has a higher coefficient of thermal expansion than that of the base layer 51. A plurality of grooves 54 (FIG. 7 shows only one groove) are formed in the surface layer 52. Further, each of the base layer 51 and the surface layer 52 may be composed of a single layer or may be composed of a plurality of layers. In this case, since the plural grooves 54 are provided in the surface layer 52, it is also possible to reduce thermal expansion of the surface layer 52, and as a result to reduce thermal deformation of the multilayer substrate 50.

Each of the above embodiments has described the case where the multilayer substrate is applied to the probe card, but the present invention is not limited to the above-described embodiments, and the multilayer substrate of the present invention is widely applicable to multilayer substrates exposed to a high-temperature environment.

INDUSTRIAL APPLICABILITY

The present invention can be suitably utilized as a multilayer substrate and a probe card exposed to a high-temperature environment.

What is claimed is:
1. A multilayer substrate comprising: a base layer; and a first surface layer stacked on at least one surface of the base layer, the first surface layer having a higher coefficient of thermal expansion than a coefficient of thermal expansion of the base layer,
 wherein grooves dividing the first surface layer into a plurality of areas are provided in the first surface layer,
 wherein a second surface layer is made provided on the other surface of said base layer, and wherein the grooves of said first surface layer are formed so as to make an amount of expansion of said first surface layer become closer to an amount of expansion of said second surface layer when a temperature difference occurs between both surfaces of the multilayer substrate.

2. The multilayer substrate according to claim 1,
wherein said base layer is exposed from the grooves dividing said first surface layer.

3. The multilayer substrate according to claim 1,
wherein said first surface layer is made of an organic insulating material.

4. The multilayer substrate according to claim 1,
wherein said base layer is made of an inorganic insulating material.

5. The multilayer substrate according to claim 1,
wherein the second surface layer is made of a same material as a material of the first surface layer on the one surface.

6. A probe card comprising at least one circuit board connected in an electrically conductive manner to a probe brought into electrical contact with an inspection object,
wherein said circuit board comprises: a base layer; and a first surface layer stacked on at least a surface on the inspection object side of the base layer and on which the probe is disposed, the first surface layer has a higher coefficient of thermal expansion than a coefficient of thermal expansion of the base layer, and grooves dividing the first surface layer into a plurality of areas are provided in the first surface layer
wherein a second surface layer is provided on the other surface of the base layer, and
wherein the grooves of said first surface layer are formed so as to make an amount of expansion of the first surface layer become closer to an amount of expansion of the second surface layer at the time of inspection.

7. The probe card according to claim 6,
wherein the base layer is exposed from the grooves dividing the first surface layer.

8. The probe card according to claim 6,
wherein the first surface layer is made of an organic insulating material.

9. The probe card according to claim 6,
wherein the base layer is made of an inorganic insulating material.

10. The probe card according to claim 6,
wherein the second surface layer is made of a same material as a material of the first surface layer on the one surface.

11. A probe card comprising a contactor brought into electrical contact with an inspection object, the contactor including a plurality of probes and a circuit board to which the probes are attached,
wherein said circuit board comprises: a base layer; and a first surface layer stacked on at least a surface on the inspection object side of the base layer and on which the probe is disposed, the first surface layer has a higher coefficient of thermal expansion than a coefficient of thermal expansion of the base layer, and grooves dividing the first surface layer into a plurality of areas are provided in the first surface layer,
wherein a second surface layer is provided on the other surface of the base layer, and
wherein the grooves of the first surface layer are formed so as to make an amount of expansion of the first surface layer become closer to an amount of expansion of the second surface layer at the time of inspection.

12. The probe card according to claim 11, wherein the base layer is exposed from the grooves dividing the first surface layer.

13. The probe card according to claim 11, wherein the first surface layer is made of an organic insulating material.

14. The probe card according to claim 11, wherein the base layer is made of an inorganic insulating material.

15. The probe card according to claim 11,
wherein the second surface layer is made of a same material as a material of the first surface layer on the one surface.

* * * * *